United States Patent
Simon et al.

(10) Patent No.: US 11,094,355 B1
(45) Date of Patent: Aug. 17, 2021

(54) MEMORY CHIP OR MEMORY ARRAY FOR WIDE-VOLTAGE RANGE IN-MEMORY COMPUTING USING BITLINE TECHNOLOGY

(71) Applicant: ECOLE POLYTECHNIQUE FEDERALE DE LAUSANNE (EPFL), Lausanne (CH)

(72) Inventors: William Andrew Simon, Prilly (CH); Marco Antonio Rios, Chavannes-Renens (CH); Alexandre Sébastien Levisse, Lausanne (CH); Marina Zapater, Chavannes-Renens (CH); David Atienza Alonso, Echandens-Denges (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 16/866,566

(22) Filed: May 5, 2020

(51) Int. Cl.
| | |
|---|---|
| *G11C 7/12* | (2006.01) |
| *G11C 7/10* | (2006.01) |
| *G11C 7/14* | (2006.01) |
| *G11C 7/06* | (2006.01) |

(52) U.S. Cl.
CPC ............... *G11C 7/12* (2013.01); *G11C 7/065* (2013.01); *G11C 7/106* (2013.01); *G11C 7/1012* (2013.01); *G11C 7/1027* (2013.01); *G11C 7/1087* (2013.01); *G11C 7/14* (2013.01)

(58) Field of Classification Search
CPC ......... G11C 7/12; G11C 7/065; G11C 7/1012; G11C 7/1027; G11C 7/106; G11C 7/1087; G11C 7/14
USPC .......................................................... 365/203
See application file for complete search history.

(56) References Cited

U.S. PATENT DOCUMENTS

2013/0028032 A1\* 1/2013 Koike ................... G11C 11/413
365/189.15

OTHER PUBLICATIONS

Aga, S., Jeloka, S., Subramaniyan, A., Narayanasamy, S., Blaauw, D., & Das, R. (Feb. 2017). Compute caches. In 2017 IEEE International Symposium on High Performance Computer Architecture (HPCA) (pp. 481-492). IEEE.

Agrawal, A., Jaiswal, A., Lee, C., & Roy, K. (2018). X-sram: Enabling in-memory boolean computations in cmos static random access memories. IEEE Transactions on Circuits and Systems I: Regular Papers, 65(12), 4219-4232.

(Continued)

*Primary Examiner* — Xiaochun L Chen
(74) *Attorney, Agent, or Firm* — Andre Roland S.A.; Nikolaus Schibli (57) ABSTRACT

A random access memory having a memory array having a plurality of local memory groups, each local memory group including a plurality of bitcells arranged in a bitcell column, a pair of local bitlines operatively connected to the plurality of bitcells, a pair of global read bitlines, a local group read port arranged between the pair of local bitlines and the pair of global read bitlines for selectively accessing one of the local bitlines depending on a state of a selected bitcell, and a local group precharge circuit operatively arranged between the pair of local bitlines.

24 Claims, 10 Drawing Sheets

(56) References Cited

OTHER PUBLICATIONS

Akyel, K. C., Charles, H. P., Mottin, J., Giraud, B., Suraci, G., Thuries, S., & Noel, J. P. (Oct. 2016). DRC 2: Dynamically Reconfigurable Computing Circuit based on memory architecture. In 2016 IEEE International Conference on Rebooting Computing (ICRC) (pp. 1-8). IEEE.
B. Reese. (Jan. 2019) Ai at the edge: A gigaom research byte. GigaOm.
Chan, P. K., & Schlag, M. D. F. (1990). Analysis and design of CMOS Manchester adders with variable carry-skip. IEEE Transactions on Computers, 39(8), 983-992.
Chang, J., Chen. Y. H., Chan, W. M., Singh, S. P., Cheng, H., Fujiwara, H., . . . & Liao, H. J. (Feb. 2017). 12.1 a 7nm 256mb sram in high-k metal-gate finfet technology with write-assist circuitry for low-v min applications. In 2017 IEEE International Solid-State Circuits Conference (ISSCC) (pp.
Chang, L., Nakamura, Y., Montoye, R. K., Sawada, J., Martin, A. K., Kinoshita, K., . . . & Hosokawa, K. (Jun. 2007). A 5.3 GHz 8T-SRAM with operation down to 0.41 V in 65nm CMOS. In 2007 IEEE Symposium on VLSI Circuits (pp. 252-253). IEEE.
Chang, M.C., Pan, Z. G., & Chen, J. L. (Oct. 2017). Hardware accelerator for boosting convolution computation in image classification applications. In 2017 IEEE 6th Global Conference on Consumer Electronics (GCCE) (pp. 1-2). IEEE.
Chang, M. F., Chen, C. F., Chang, T. H., Shuai, C. C., Wang, Y. Y., & Yamauchi, H. (Feb. 2015). 17.3 A 28nm 256kb 6T-SRAM with 280mV improvement in V MIN using a dual-split-control assist scheme. In 2015 IEEE International Solid-State Circuits Conference—(ISSCC) Digest of Technical.
Deng, Q., Jiang, L., Zhang, Y., Zhang, M., & Yang, J. (Jun. 2018). DrAcc: a DRAM based accelerator for accurate CNN inference. In Proceedings of the 55th Annual Design Automation Conference (pp. 1-6).
Dong, Q., Jeloka, S., Saligane, M., Kim, Y., Kawaminami, M., Harada, A., . . . & Sylvester, D. (Jun. 2017). A 0.3 V VDDmin 4+2T SRAM for searching and in-memory computing using 55nm DDC technology. In 2017 Symposium on VLSI Circuits (pp. C160-C161). IEEE.
Eckert, C., Wang, X., Wang, J., Subramaniyan, A., Iyer, R., Sylvester, D., . . . & Das, R. (Jun. 2018). Neural cache: Bit-serial in-cache acceleration of deep neural networks. In 2018 ACM/IEEE 45th Annual International Symposium on Computer Architecture (ISCA) (pp. 383-396). IEEE.

Haj-Ali, A., Ben-Hur, R., Wald, N., & Kvatinsky, S. (May 2018). Efficient algorithms for in-memory fixed point multiplication using magic. In 2018 IEEE International Symposium on Circuits and Systems (ISCAS) (pp. 1-5). IEEE.
Jeloka, S., Akesh, N. B., Sylvester, D., & Blaauw, D. (2016). A 28 nm configurable memory. (TCAM/BCAM/SRAM) using push-rule 6T bit cell enabling logic-in-memory. IEEE Journal of Solid-State Circuits, 51(4), 1009-1021
Kang, M., Kim, E. P., Keel, M. S., & Shanbhag, N. R. (May 2015). Energy-efficient and high throughput sparse distributed memory architecture. In 2015 IEEE International Symposium on Circuits and Systems (ISCAS) (pp. 2505-2508). IEEE.
Kooli, M., Charles, H. P., Touzet, C., Giraud, B., & Noel, J. P. (Mar. 2018). Smart instruction codes for in-memory computing architectures compatible with standard sram interfaces. In 2018 Design, Automation & Test in Europe Conference & Exhibition (DATE) (pp. 1634-1639). IEEE.
Pilo, H., Adams, C. A., Arsovski, I., Houle, R. M., Lamphier, S. M., Lee, M. M., . . . & Younis, M. I. (Feb. 2013). A 64Mb SRAM in 22nm SOI technology featuring fine-granularity power gating and low-energy power-supply-partition techniques for 37% leakage reduction. In 2013 IEEE International.
Seshadri, V., Lee, D., Mullins, T., Hassan, H., Boroumand, A., Kim, J., . . . & Mowry, T. C. (Oct. 2017). Ambit: In-memory accelerator for bulk bitwise operations using commodity DRAM technology. In 2017 50th Annual IEEE/ACM International Symposium on Microarchitecture (MICRO) (pp. 273-287).
Simon, W. A., Qureshi, Y. M., Levisse, A., Zapater, M., & Atienza, D. (May 2019). BLADE: A BitLine Accelerator for Devices on the Edge. In Proceedings of the 2019 on Great Lakes Symposium on VLSI (pp. 207-212).
Simon, W., Galicia. J., Levisse, A., Zapater, M., & Atienza, D. (Jun. 2019). A fast, reliable and. wide-voltage-range in-memory computing architecture. In 2019 56th ACM/IEEE Design Automation Conference (DAC) (pp. 1-6). IEEE.
Sinangil, M. E., Mair, H., & Chandrakasan, A. P. (Feb. 2011). A 28nm high-density 6T SRAM with optimized peripheral-assist circuits for operation down to 0.6 V. In 2011 IEEE International Solid-State Circuits Conference (pp. 260-262). IEEE.
Subramaniyan, A., Wang, J., Balasubramanian, E. R., Blaauw, D., Sylvester, D., & Das, R. (Oct. 2017). Cache automaton. In Proceedings of the 50th Annual IEEE/ACM International Symposium on Microarchitecture (pp. 259-272).
Wu, S. L., Li, K. Y., Huang, P. T., Hwang, W., Tu, M. H., Lung, S. C., . . . & Chuang, C. T. (2017). A 0.5-V 28-nm 256-kb mini-array based 6T SRAM with Vtrip-tracking write-assist. IEEE Transactions on Circuits and Systems I: Regular Papers, 64(7), 1791-1802.

* cited by examiner

|  | Jeloka [7] | Akyel [2] | This Work |
|---|---|---|---|
| Bitcell Density | 6T | 10T | 6T |
| Memory Access | 1Rd/1Wr | 1Wr+2Rd | 1Wr+1Rd (1 LG) 1Wr+2Rd(2 LG) |
| Sensing | | Single Ended | |
| Array Size | 64×64 | Not Simulated | 256×64 |
| Max Freq. | 800Mhz | Max Addition Freq. | 2.2Ghz |
| Add. type | no addition | Pipeline | Direct |
| Add. Freq. | - | Not Simulated | 2.2Ghz@8,16bits 1.7Ghz@32bits 1.2Ghz@64bits |

FIG. 11

| Operation | Rd | Wr | IMC | Add | | | |
|---|---|---|---|---|---|---|---|
| Type | Bitwise | | | 8b | 16b | 32b | 64b |
| E/op[fJ] | 23.5 | 25.9 | 23.8 | 20.7 | 41.6 | 83.3 | 167.3 |
| Carry Prop. Time [ps] | - | - | - | 64 | 130 | 258 | 512 |
| Array Leak./op [fJ] | 88.9 | | | | | 136.9 | 162.9 |
| Freq.[Ghz] | 2.2 | 2.2 | 2.2 | 2.2 | 2.2 | 1.7 | 1.2 |

MEMORY CHIP OR MEMORY ARRAY FOR WIDE-VOLTAGE RANGE IN-MEMORY COMPUTING USING BITLINE TECHNOLOGY

FIELD OF THE INVENTION

The present invention is directed to the field of random access memories (RAM) and their architecture, and methods of reading out and writing to random access memories, more specifically the invention is directed to bitline memory architecture and in-memory computing (IMC).

BACKGROUND

As the computational complexity of applications on the consumer market, such as high-definition video encoding, use of neural networks, and machine learning, become ever more demanding, novel ways to efficiently compute data intensive workloads with efficient memory architecture and management are being explored. In this context, In-Memory Computing (IMC) solutions, and particularly bitline (BL) computing in static random-access memories (SRAM), appear promising as they mitigate one of the most energy consuming aspects in computation: data movement. While IMC architectural level characteristics have been defined by the research community, only a few works so far have explored the implementation of such memories at a low level. Furthermore, these proposed solutions are either slow, for example slower than 1 GHz, area hungry (10T SRAM), or suffer from read disturb and corruption issues. Overall, there is no extensive design study considering realistic assumptions at the circuit level.

More specifically, data intensive workloads such as artificial intelligence or real-time video streaming and rendering applications require more and more computational capabilities both in so-called "edge devices" and in servers. In this context, increasing efficiency, understood as reducing energy consumption while maintaining or enhancing performance, is a major concern in both scenarios. Recently, In Memory Computing (IMC) solutions have been proposed as a method for substantially increasing computational capabilities while simultaneously reducing energy consumption. A subset of these innovations utilizes in-SRAM computing (in-cache or scratchpad memory), namely bitline computing, which has been proposed as a method for accelerating neural networks and finite state automata. For example, in the publication Aga et al., "Compute Caches," IEEE International Symposium on High Performance Computer Architecture (HPCA), pp. 481-492, IEEE, 2017, and in the publication Akyel et al., "DRC$^2$: Dynamically Reconfigurable Computing Circuit based on memory architecture," IEEE International Conference on Rebooting Computing (ICRC), pp. 1-8, IEEE, 2016, these references herewith incorporated by reference in their entirety, it has been discussed that while there is a need for SRAM-based IMC solutions, 6T SRAM-based IMC solutions struggle with read disturb data corruption, limiting profitability for ultra-low power or high performance applications in terms of degraded read stability and reduced speed. To address this issue, Akyel et al. proposes the use of 10 T SRAM bitcells which do not suffer from read disturb issues, at the expense of reducing the bitcell array density (at least 2× lower than 6T bitcells), confining it to low density applications. The same work also proposes the use of a memory-embedded capacitive adder to perform in-memory additions. However, they do not target to cover low-power implementations in their layouts and designs, and the focus is only on performance considerations from a circuit perspective. In the publication Kang et al., "Energy-efficient and high throughput sparse distributed memory architecture," IEEE International Symposium on Circuits and Systems (ISCAS), pp. 2505-2508, IEEE, 2015, this reference herewith incorporated by reference in its entirety, a capacitive analog adder is proposed, however, such analog-based approaches suffer from high variability, limited supply range, and slow operation.

Accordingly, despite some advancements in the field of SRAM in-memory computing, there is a strong need for faster memory read and write operations, highly integrated solutions, improved reliability, and allowing operation with various voltages.

SUMMARY

According to one aspect of the present invention, a random-access memory or a memory chip is provided. Preferably, the random access memory or the memory chip include a memory array having a plurality of local memory groups, each local memory group including a plurality of bitcells arranged in a bitcell columns, a pair of local bitlines operatively connected to the plurality of bitcells, a pair of global read bitlines, a local group read port arranged between the pair of local bitlines and the pair of global read bitlines for selectively accessing one of the local bitlines depending on a state of a selected bitcell, and a local group precharge circuit operatively arranged between the pair of local bitlines.

According to still another aspect of the present invention, an in-memory computing logic is provided, including a global read bitlines multiplexer operationally connected to pairs of global read bitlines of the plurality of local memory groups, a bitline operational block for performing an operation, the bitline operational block operationally connected to an output of the global read bitlines multiplexer, and an operation multiplexer that is operationally connected to an output of the bitline operational block, having a write back latch and a write back multiplexer.

According to yet another aspect of the present invention, a word line driver is provided, operatively connected to word lines of the memory array, and two or more word line decoders are provided that are operatively connected to outputs of the word line driver to provide for decoded addresses, and a word line fusion circuit is provided that is operatively connected to the decoded addresses.

According to a further aspect of the present invention, an operational block for performing a logic, analog, and/or mathematical operation on signals of the outputs of the amplifiers is provided, for example but not limited to adders, multipliers, averaging, comparators. As an example, the operational block can include a fast carry adder is provided that is based on a dynamic Manchester Carry Chain adder operatively connected to outputs of the amplifiers, and preferably, the fast carry adder is arranged in a buffered 4-bit configuration for sixteen (16) bitcell columns. Other types of logic, analog, arithmetic, or other mathematical operations, or a combination thereof, can also be performed by the operational block.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

Herein, identical reference characters are used, where possible, to designate identical elements that are common to the figures. Also, the images in the drawings are simplified for illustration purposes and may not be depicted to scale.

DETAILED DESCRIPTION OF THE SEVERAL EMBODIMENTS

Figure 1A:
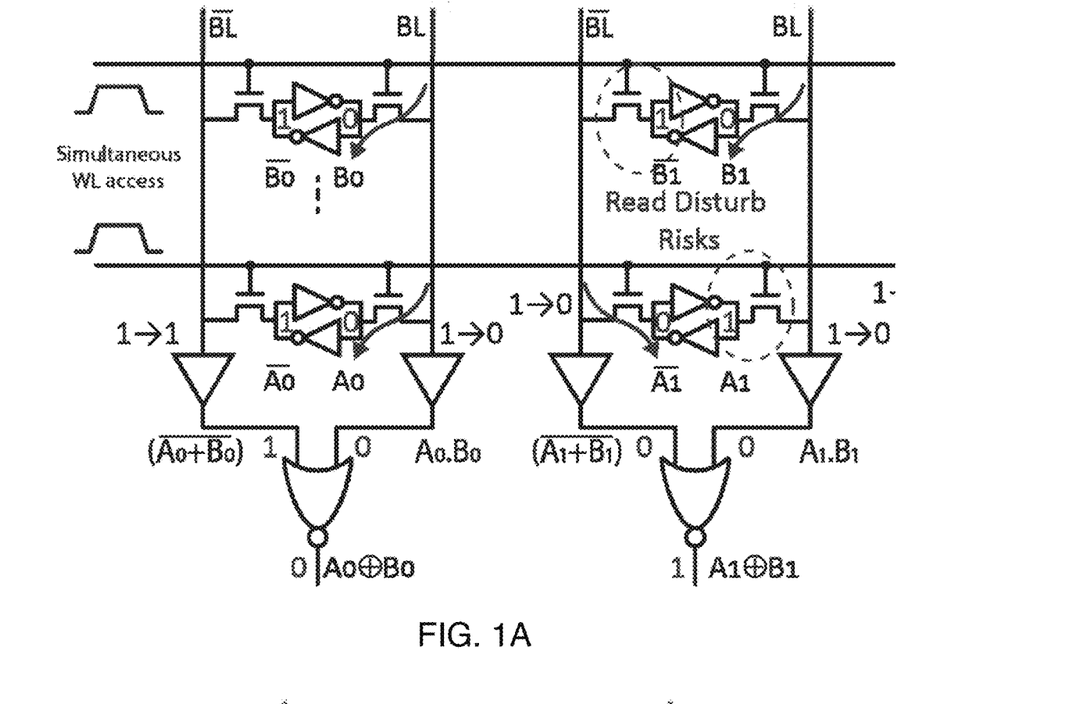
FIGS. 1A and 1B show exemplary diagram schematics showing the concept of bitline (BL) computing, with FIG. 1A showing the schematic of an exemplary conventional bitline computing with highlighted read disturb risks and FIG. 1B showing an exemplary schematic of the proposed local bitlines-based bitline computing according to an aspect of the invention.
Figure 1B:
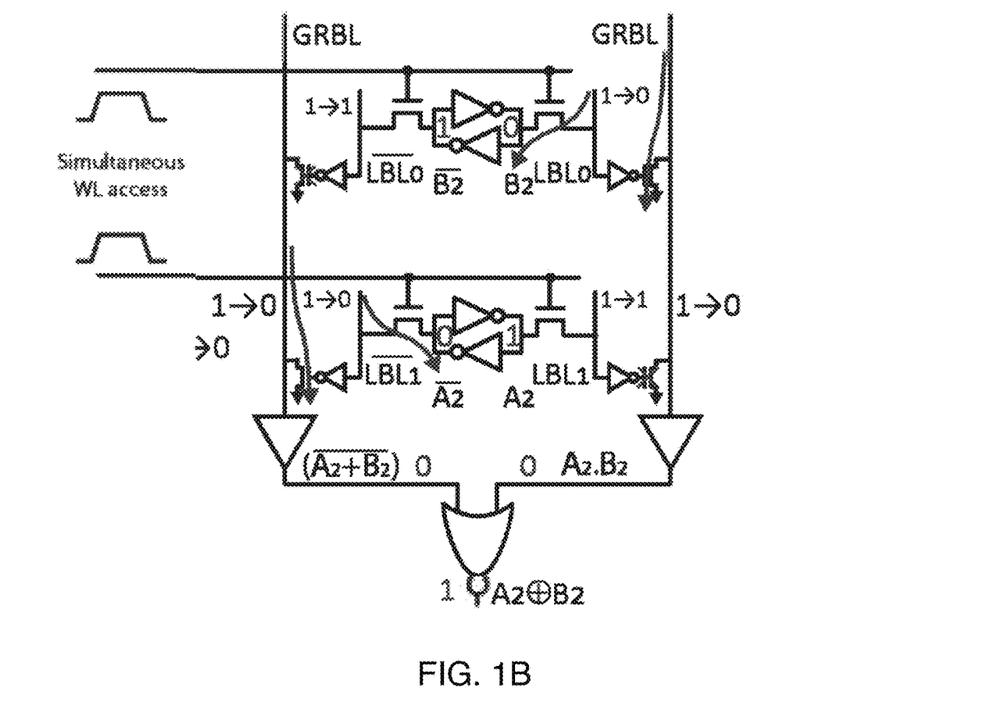
Figure 2:
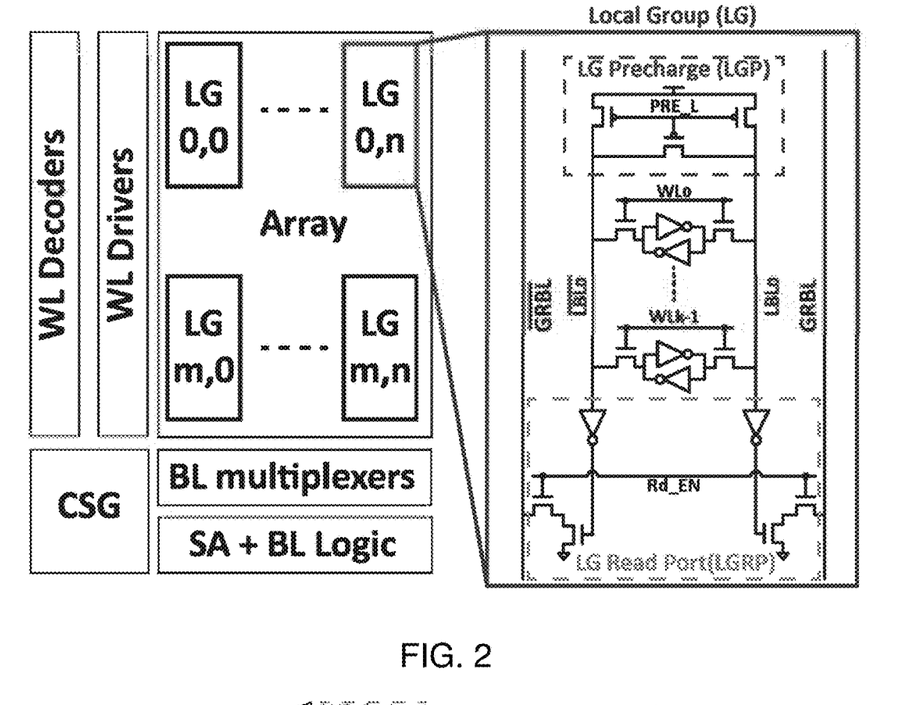
FIG. 2 shows an exemplary schematic of the proposed memory organization with detailed Local Group (LG) schematic diagram that is highlighted and showing a zoomed-in detailed section, with the Local Group Precharge (LGP) and the Local Group Read Port (LGRP) circuits being highlighted, according to an aspect of the invention.

As shown in FIGS. 1B and 2 with an exemplary embodiment, a random access memory or a memory chip is provided that uses local bitline-based bitline (BL) computing, organized in an array of local groups (LG). For example, the random access memory or the memory chip include a memory array having a plurality of local memory groups LG, each local memory group LG including a plurality of bitcells arranged in a bitcell columns, a pair of local bitlines (LBL) operatively connected to the plurality of bitcells, a pair of global read bitlines (GRBL), word lines (WL) operatively connected to the bitcells, a local group read port (LGRP) arranged between the pair of local bitlines LBL and the pair of global read bitlines GRBL for operative connection, and a local group precharge circuit (LGP) operatively arranged between the pair of local bitlines. In addition, as exemplarily shown in FIG. 2, the memory array or chip further includes bit line multiplexers BL, amplifiers such as sense amplifiers (SA) and BL logic, WL decoders and WL drivers, and a control signal generation (CSG) circuit or block. Each bitcell includes two cross-coupled inverters that can sustain one or two steady states that represent 1 or 0. These state values can be detected by charging the local bitlines (LBL) that are attached to the bitcell, and by charging the word line (WL) attached to the bitcell, resulting in one LBL discharging while the other LBL remains charged. With FIG. 1B and the arrows, a conceptional view of the operation is given of the herein presented memory.

The random-access memory described herein, its elements, and its architecture can be implemented with different types of memory technologies and can be part of different types of memory systems. For example, the implementation of the architecture is possible with static random access memory (SRAM) cells, but it is also possible that the herein proposed memory architecture is implemented to different memory technologies, for example but not limited to resistive random access memory (RRAM), dynamic random access memory (DRAM), oxide-based memory, filamentary-based memory, conductive bridge-based memory, magnetic-based memory for example magneto-resistive random-access memory (MRAM), including but not limited to spin-orbit torque and spin-transfer torque, ferroelectric, phase change memory, and a combination thereof, for example for hybrid-memory types. Moreover, it is also possible that this memory architecture is used for charge trapping memories for example flash charge trapping memories, for example floating gate or oxide-nitride-oxide (ONO) memory. Moreover, the memory architecture can be implemented to different memory architecture and system environments, for example a regular microchip, integrated to a standard system memory hierarchy such as but not limited to cache memories for example for the in-cache computing, scratchpad memories or other types of memories that do not have a cache protocol, accelerator-centric memories that can be used in general-purposes multi-core systems ranging from embedded devices to desktop and server systems, as well as graphical processing units (GPUs) or as an accelerator, or for integration into a programmable logic device such as field programmable gate array (FPGA) devices and complex programmable logic devices (CPLD).

Generally, with respect to bitline computing in memories and their operations, beyond standard read and write operations, in-memory computing operations can be performed on one (shift, copy) or two operands (NOR, AND, XOR, ADD). Standard operations, such as read and write operations are performed in a standard manner by accessing a single wordline (WL). As the proposed memory uses local bitlines, before each read operation, both local and global Read BLs (LBLs, GRBLs) are precharged to Vdd. Then, the WL is activated. One of the LBLs discharges, activating one of the Local Read Ports (LRP), in turn discharging of one of the GRBLs, as demonstrated in [12, 14], these two references herewith incorporated by reference in its entirety. Two amplifiers, for example but not limited to two sense amplifiers (SA), are connected to the GRBLs output the data. Overall, the proposed memory array or memory chip enables simultaneous 1 read+1 write operation (2-ports), or 2 read+1 write (3-ports) by accessing the GRBL independently if all the accessed words belong to different LBLs. Generally, the state-of-the-art IMC operations are slow. Specifically, IMC operations can be performed by simultaneously accessing two WLs after a precharge phase to the supply voltage Vdd. Depending on the states of the accessed bitcells, one or both of the BLs are discharged as shown FIG. 1A. In the end, the BL (respectively $\overline{BL}$) carries the result of an AND operation (respectively NOR). These operations form the basis of bitline computing. Data corruption can occur when an IMC operation is performed on standard exemplary 6T bitcells in opposite states, as exemplarily shown in FIG. 1A. If the PMOS transistor of one bitcell is weaker than the access and pulldown transistors of the other bitcell, the cell may flip, leading to data corruption. This effect can be shown with variability simulations, particularly in the slowP-FastN CMOS corner. In the publication of Jeloka et al., "A 28 nm configurable memory (TCAM/BCAM/SRAM) using push-rule 6T Bit Cell Enabling Logic-in-Memory." IEEE Journal of Solid-State Circuits, Vol. 51, No. 4, pp. 1009-1021, 2016, this reference herewith incorporated by reference in its entirety, and the aforementioned Aga et al., data corruption is avoided by strongly reducing the WL voltage (and thus also the operation frequency, to lower than 1 Ghz).

With the proposed memory array or memory chip, a fast and reliable IMC architecture is proposed, that uses an innovative approach to performing bitline computing-based IMC operations with exemplary 6T SRAM bitcells while avoiding read disturb risks. Other bitcells can also be used, for example but not limited to 4T, 5T, 7T, 8T, 9T, 10T, 12T bitcells. The two accessed bitcells are always connected to different local bitlines (LBLs), for example a pair or bitlines, eliminating the risk of bitcell shorting, as exemplarily illustrated in FIG. 1B. In other words, while the bitcell have the same state, the bitcell will simply discharge by the faster one of the BL. If they hold a different state, then, while one is trying to maintain the BL state, the other one is pulling it down. This is visible in the right hand side of FIG. 1A. As the PMOS tend to be weaker than NMOS, if the bitcell access transistors are too strong, the PMOS will not be able to hold the '1' and the bitcell may flip. Thereby, a solution can be the Wordline underdrive that allows to reduce the WL voltage to increase the resistivity of the access transistors, but this may reduce an operation frequency. Therefore, according to one aspect, the local bitline is split or multiplied into two or more local bitlines LBL, and these are in turn operatively connected to global read bitlines GRBL through a read port. Thereby, if accessing simultaneously two bitcells are accessed in two different LBL, the signal path is cut due to the read port and bitline computing can be done on the GRBL without risking to lose the states. Within an LBL, an IMC operation is identical to a standard read. Then, either one or both of the GRBLs are discharged through local group read ports (LGRP) depending on the states of the accessed bitcells. By isolating the bitcells from each other via LGRPs, risk of data corruption is eliminated. As previously described, the GRBL (resp. $\overline{GRBL}$) carries the result of an AND (resp. NOR) between the two operands. This approach enables full WL dynamic voltage range without read disturb issues.

With respect to the organization of the memory array, FIG. 2 shows an exemplary and simplified schematic thereof. Besides the memory array that includes several local groups LG, it contains: (i) WL decoders and drivers, (ii) BL multiplexers to enable data interleaving, (iii) sense amplifiers (SA) and (iv) a BL operational block, for example a logic block that performs logic operations. In addition, the control signals (such as the local group precharge PRE_L and enable Rd_EN signals) are generated in the Control Signal Generation (CSG) circuit or block. Inside the memory array, the bitcells are organized into Local Groups (LGs). Each LG contains k bitcells along an LBL, an LG Read Port (LGRP), a Local Group Precharge (LGP), and is connected to a GRBL through its LGRP. The GBRLs are connected to two amplifiers, for example two single ended SAs, which are in turn connected to the BL operational block, for example a logic block. Different types of amplifiers can be used, for example but not limited to voltage amplifiers, differential amplifiers, memory refresh amplifiers in the case of DRAM. The BL operational block that is further described below can perform bitwise NOR, AND, and XOR operations as well as more complex operations, such as copy, shift, and addition, and also analog operations, for example a charge sharing multiplier or other types of analog signal based operations.

Figure 3:
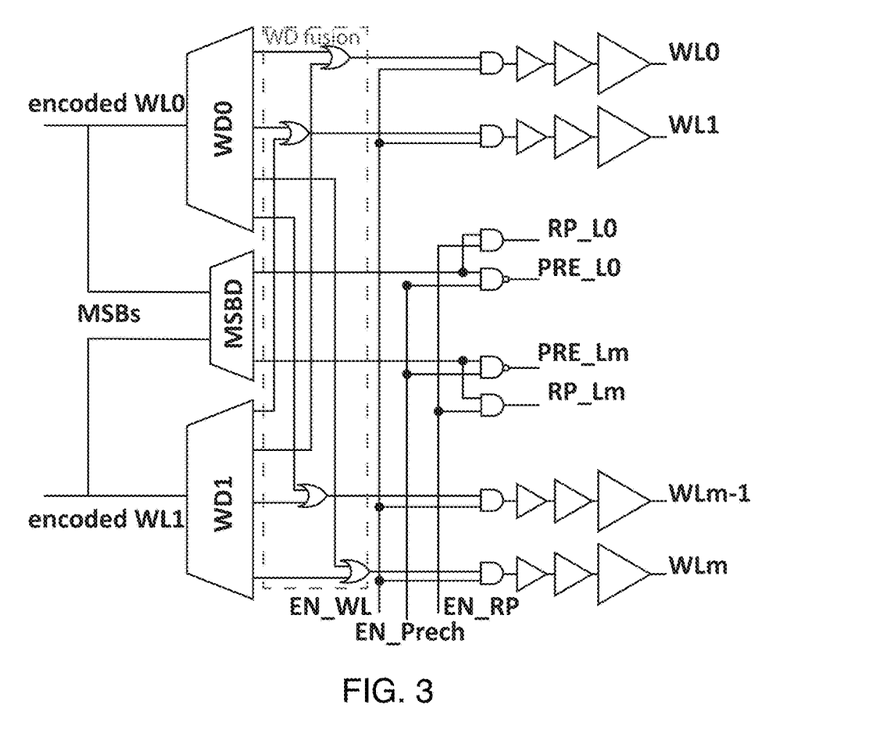
FIG. 3 shows an exemplary block schematic of the modified word line (WL) decoder according to an aspect of the invention.

Moreover, with respect to the decoding logic and the precharge management, according to an aspect of the present invention, a straightforward WordLine (WL) decoding architecture is proposed as exemplarily shown in FIG. 3, including two WL Decoders (WDs) connected to a single WL driver. For example, two encoded word line WL addresses to the operation operands are decoded by WD0 and WD1. An OR operation between the decoded addresses is performed before driving the WLs, highlighted as a circuit "WD fusion" in FIG. 3, to translate the encoded accessed addresses into signals that can control the memory lines. In the example of FIG. 3, an optimized decoder is shown that controls (i) the word line WL per local group LG, (ii) the precharge of the local groups LG, (iii) the read port enable RP_EN.

It is also possible that a write enable signal controls the write port, with another EN_RP_wr signal that is vertically arranged. This signal could pass through an AND port with the outputs of the MSBD and control the write port (not shown in FIG. 2). The addresses are cut into two, with the LSB and the MSB, and the LSB corresponds to the position of the word to access inside the local group LG, and the MSB corresponds to the local group LG to access. As an example, if there are four (4) LG of 32 bits, we keep 5 bits for the LSBs and 2 bits for the MSBs. Thereby, it is possible to decode the LSB with a regular decoder and this provides 32 bits one-hot encoded word. Same for the MSB, both of them are decoded in one-hot and their outputs are ORed. To simplify the illustration, the MSBD is not detailed. In a simple version, it would include two (2) decoder+the WD fusion.

The WD fusion basically makes sure that the outputs of two decoders are now generating some kind of "two-hot" encoding scheme. These signals can be controlled as follows. That is where the vertical enable lines come in (these signals are standard in memory design): The EN_WL signal can perform a AND with all the decoded LSB addresses. It only passes the '1' from the decoder IF the EN_WL is activated. This signal controls the shape of the WL signal and avoids having artifacts from the decoder if no operation is expected. With respect to EN_Prech: this signal is NANDed with the decoded MSBs. Idle state is at '1' because it controls PMOS transistors connected between the LBL and the Vdd. If both decoded MSB and EN_Prech are at '1' the output changes to '0' and charge the LBL to vdd. This signal controls the precharge timing and is timed right before the EN_WL signal. Regarding the EN_RP, the same for the EN_WL but for the read port (RD_EN in FIG. 2). It is ANDed with the decoded MSB and thereby activates the ReadPort only when the Local group is selected and a IMC operation is done. Moreover, the EN_WR does the same but would control the write port (not represented FIG. 2)

To minimize local precharge energy consumption, only the accessed local group (LG) local bitlines (LBLs) are precharged. This is accomplished by decoding the address MSBs separately to generate (i) the PRE_L precharge signals controlling the LGP circuits and (ii) the Rd_EN activating the LGRP circuit. FIG. 3 presents an exemplary schematic of the architecture of the decoding circuit. It is possible to provide more optimized word decoding (WD) implementations.

Figure 4:
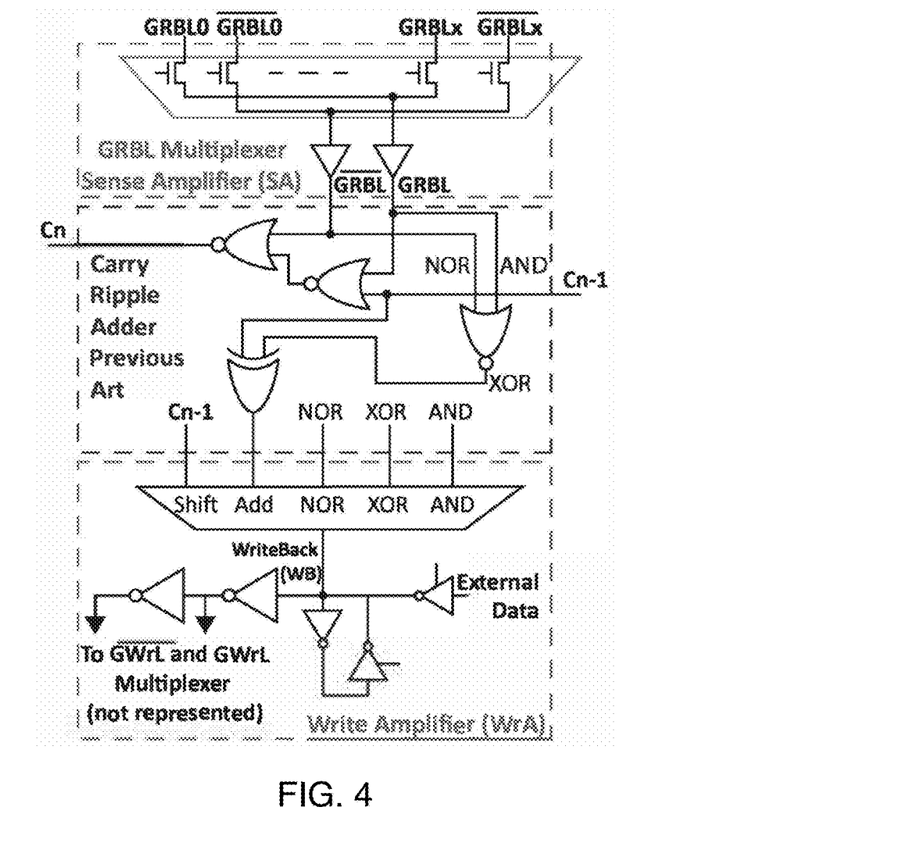
FIG. 4 shows an exemplary block schematic of the BL logic according to an aspect of the invention.

With respect to the bitline (BL) logic and its architecture, FIG. 4 represents an exemplary schematic of the IMC logic, according to an aspect of the present invention. The IMC logic includes several subblocks or sub-circuits that are connected in series: (i) a GRBL multiplexer and dual single ended SAs including inverter-based buffers that amplify the GRBL signals, (ii) a BL operational block that performs bitwise and complex operations, and (iii) an operation multiplexer, WriteBack latch, and WriteBack multiplexer for latching selected operation results, generating write patterns, and writing back to memory via GWrLs. The WriteBack multiplexer is not represented, as it is identical to GRBL multiplexer. The operation multiplexer selects the data to be written back or sent to the CPU or other external device via the memory H-tree. The operation multiplexer controls the type of operation to be performed in the BL operational block. In that sense, the operation multiplexer selects the operation to be latched between and enabling the achievement of the following exemplary operations AND, NOR, XOR, shift that could be left or right, add, sub, or any other operation. The operations that can be performed by the IMC logic can include different other types of operations, and the operation multiplexer would simply enable a different set of operations. Copy and shift operations access only one WL and write back the AND and carry ripple signals (Cn signals) respectively. As shown in FIG. 4, the BL operational block can exemplarily include an adder circuit, but can include different types of logic, analog and arithmetic operations that can directly be performed to the data or signals that are provided by the sense amplifiers SA, for example but not limited to multiplication, averaging, data comparison, other mathematical or logical operation or a combination thereof, as discussed above.

With the background art described in Akyel et al., addition is performed in three (3) cycles. First, the data is read from the memory. Then, ripple carry propagation occurs over the next cycle. Finally, the addition logic is completed in the last cycle. These three (3) operations are performed in a pipeline manner, resulting in a 1-cycle operation once the pipeline is filled. However, such a solution adds a non-negligible area overhead (i.e. three (3) latches per BL operational block) and limits the memory frequency to the slowest of the frequencies of the three pipeline stages. For example, the Carry Ripple Adder (CRA), which can exceed 1 ns for more than 32-bit additions.

However, with the proposed memory architecture or chip, the fast carry adder is directly connected to the output of the sense amplifiers (SA) of the memory. Consequently, addition starts immediately as data is read from the memory, more specifically from the bitcells, masking a portion of carry propagation time within the memory read cycle, as further described below with respect to the functional validation. In this context, the adder carry logic must be as fast as possible in order to "hide" its latency in the in-compressible periods of the memory access.

Figure 5A:
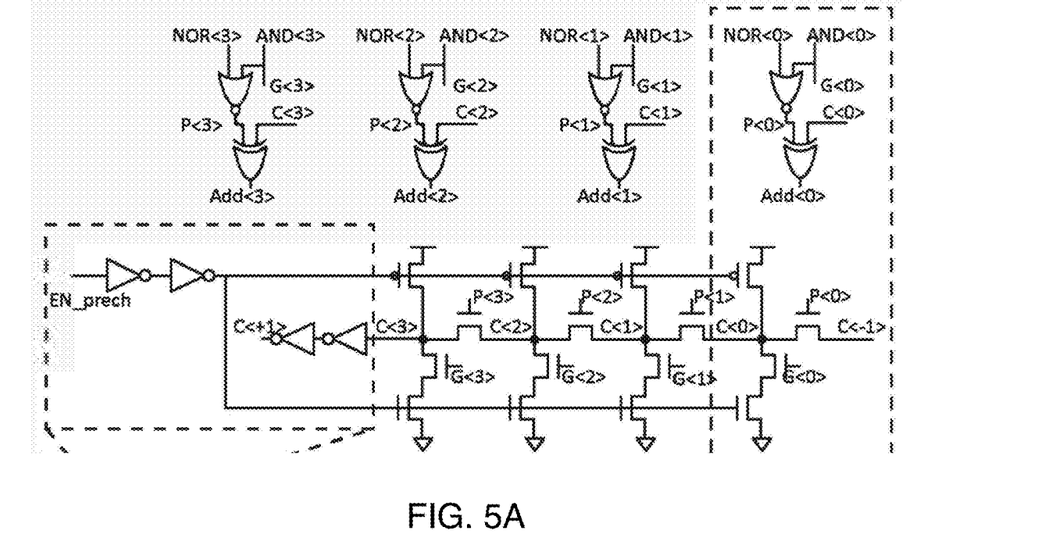
FIGS. 5A and 5B shows an exemplary schematic diagram and physical layout of the proposed fast carry ripple and full adder in an exemplary buffered four (4) stages configuration, according to an aspect of the invention.
Figure 5B:
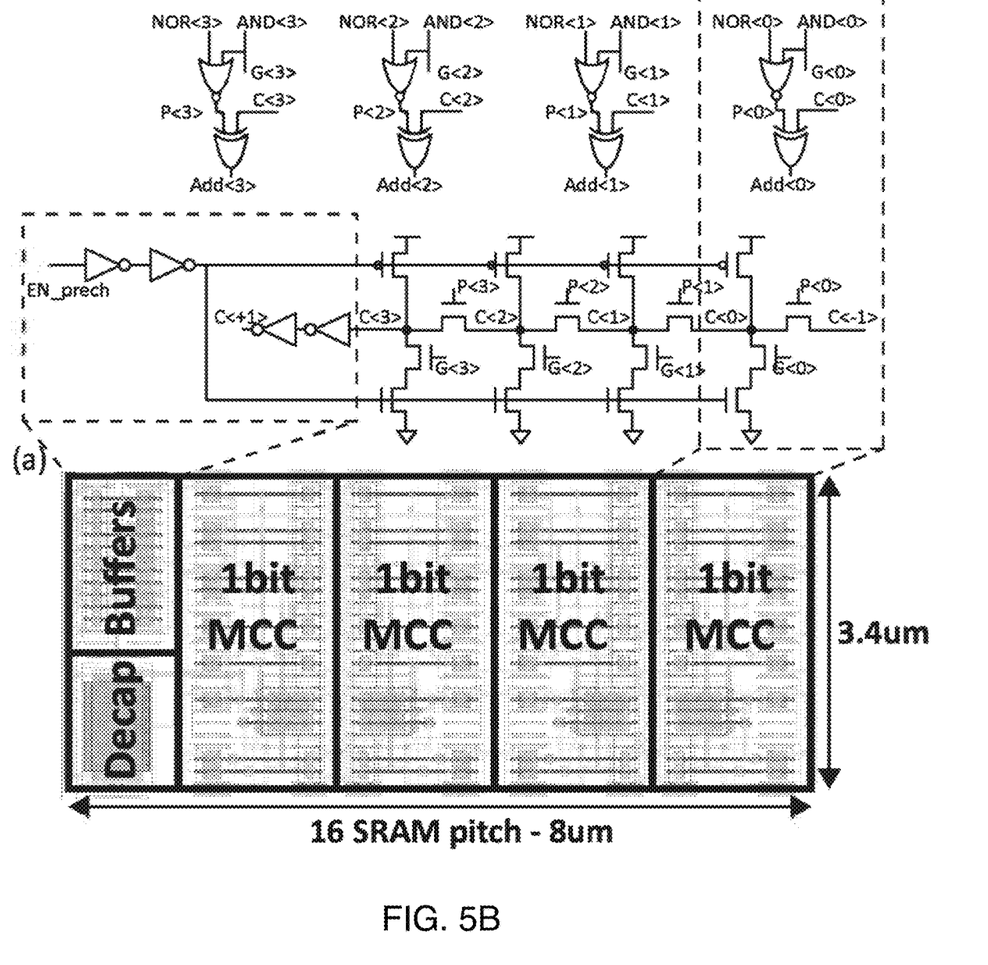

According to another aspect of the present invention, a fast carry adder is proposed as a ripple stage. To maximize carry propagation masking, a fast carry adder based on a dynamic Manchester Carry Chain (MCC) adder that is implemented in buffered 4-bits configuration is proposed, as exemplarily illustrated in FIGS. 5A and 5B, the Manchester added discussed in the publication of Chan et al., "Analysis and Design of CMOS Manchester Adders with variable Carry-Skip," IEEE Transactions on Computers, Vol. 39, No. 8, pp. 983-992, 1990, this reference herewith incorporated by reference in its entirety. The fast carry adder is directly connected to the sense amplifier (SA) outputs (NOR<0:3> and AND<0:3> signals). Generate<0:3> and Propagate<0:3> signals are simply generated with a single NOR gate thanks to bitline computing, greatly reducing the area overhead typically associated with such an architecture. FIG. 5B exemplarily represents the corresponding layout in 28 nm bulk CMOS technology, as illustration of new nano-scale technologies where this approach can be used. Four (4) Manchester Carry Chain (MCC) adders are used per sixteen (16) bitcell columns, as columns are mux-4 multiplexed. Remaining space is used to fit inter-MCC signal buffers as well as decoupling capacitors, for example 10 fF MOS capacitors. It should be noted that the same precharge signal (EN_prech) is used in both the proposed MCC and in the memory array for LBL and GRBL precharging. With FIGS. 2 and 5A it is shown that the EN_prech signal is used to perform the precharge, a signal from the MCC that is based on dynamic logic.

Figure 6A:
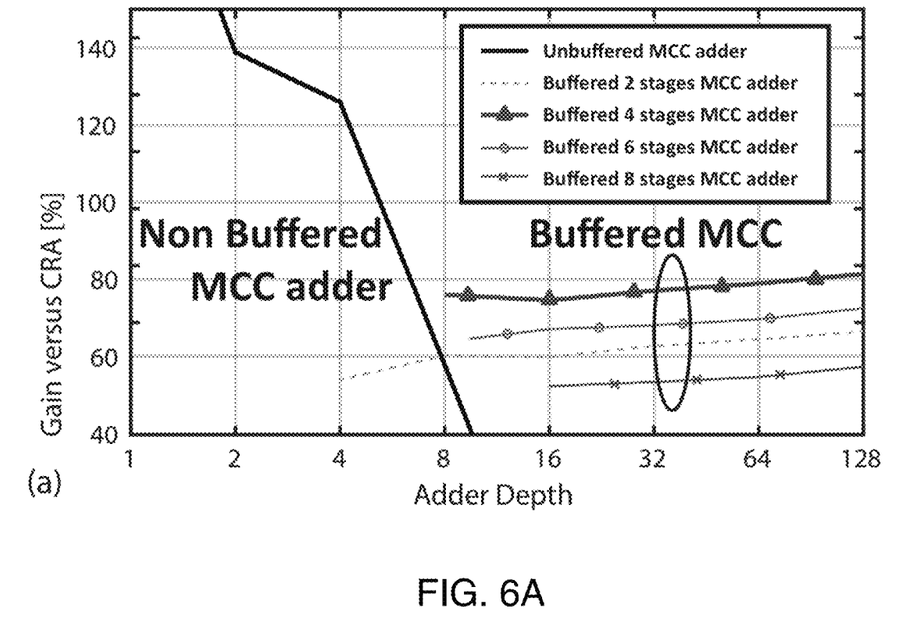
FIGS. 6A and 6B show graphs depicting the invention's performance, with FIG. 6A showing the gain provided by the proposed Manchester carry chain (MCC) adder versus carry ripple adder (CRA) for various buffer configurations and adder depths, and FIG. 6B depicting graphs that show the gain provided by a buffered four (4) stages MCC adder versus adder depth and supply voltages.
Figure 6B:
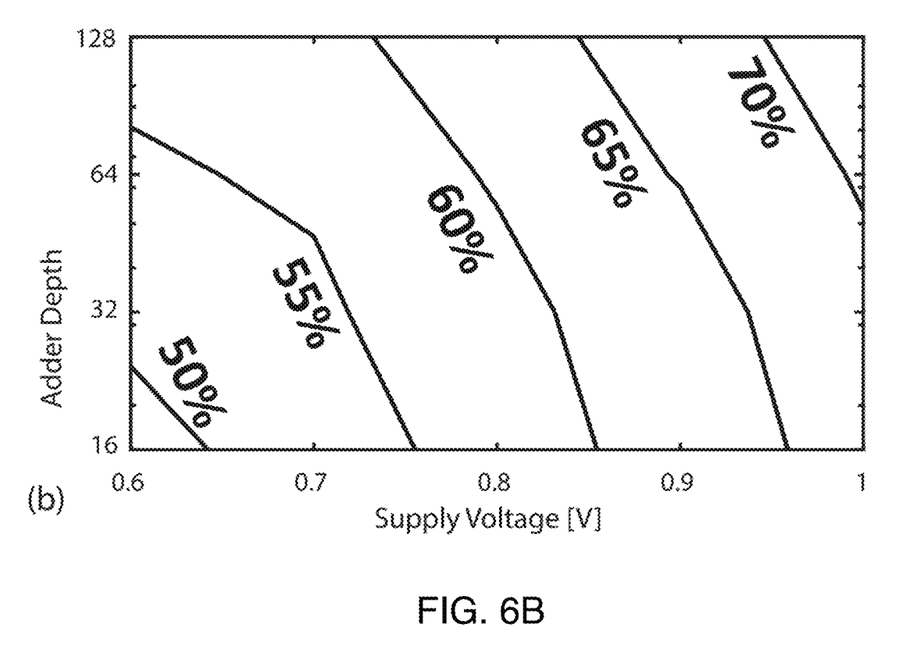

FIG. 6A shows graphs that represent the gain provided by the proposed MCC added architecture of the memory versus standard CRA adder for various MCC configurations and adder depths. Both are pitched under the memory array with post-layout parasitic and process variations included in the simulation. With near 80% performance improvement versus standard CRA, a 4-bit buffered MCC adder circuit configuration is proposed as the most efficient topology. FIG. 6B represents the performance gain of the considered 4-bit buffered topology versus the adder depth and supply voltage. While a diminishing supply voltage reduces performance (as the serial transistors become more resistive) a 54% improvement is still observed for 64 bit additions at 0.6V.

With respect to the functional validation, the functionality of the herein proposed memory architecture and design has been proven by implementing a 256WL×64BL, 32WL per local group (LG) memory array with its periphery and IMC logic, and the design has been simulated its critical path at 300K with 10,000 Monte-Carlo runs, accounting for CMOS variability and equivalent layout parasitics. To optimize the simulation time for validation, only memory critical paths are simulated (WL decoders and drivers, equivalent WLs, equivalent GRBLs, two local groups, and BL logic) in a netlist containing more than 8,000 elements. The propagation time of the signals was modelled in the memory and periphery by creating equivalent circuits for the lines with corresponding gates and extracted RC networks. The memory was implemented using thin oxide transistors from a TSMC 28 nm bulk CMOS high performance technology PDK. While the memory array is implemented in the Regular Voltage Threshold (RVT) technology flavour to limit static leakage, the Low Voltage Threshold (LVT) technology flavour was used for the peripheral circuitry in order to optimize performance. The memory array is designed considering 28 nm high density bitcells. with modified SRAM rules (a 0.127 µm SRAM bitcell design was pitched with periphery circuitry on the bottom and sides of the memory array, i.e., on 500 nm and 260 nm). The specific CMOS implementation is only an example and other nano-scale CMOS-based technologies can be used. Additionally, to account for the required spacing between the SRAM and logic design rules, a 500 nm spacing between the memory array and the periphery was considered.

Figure 7:
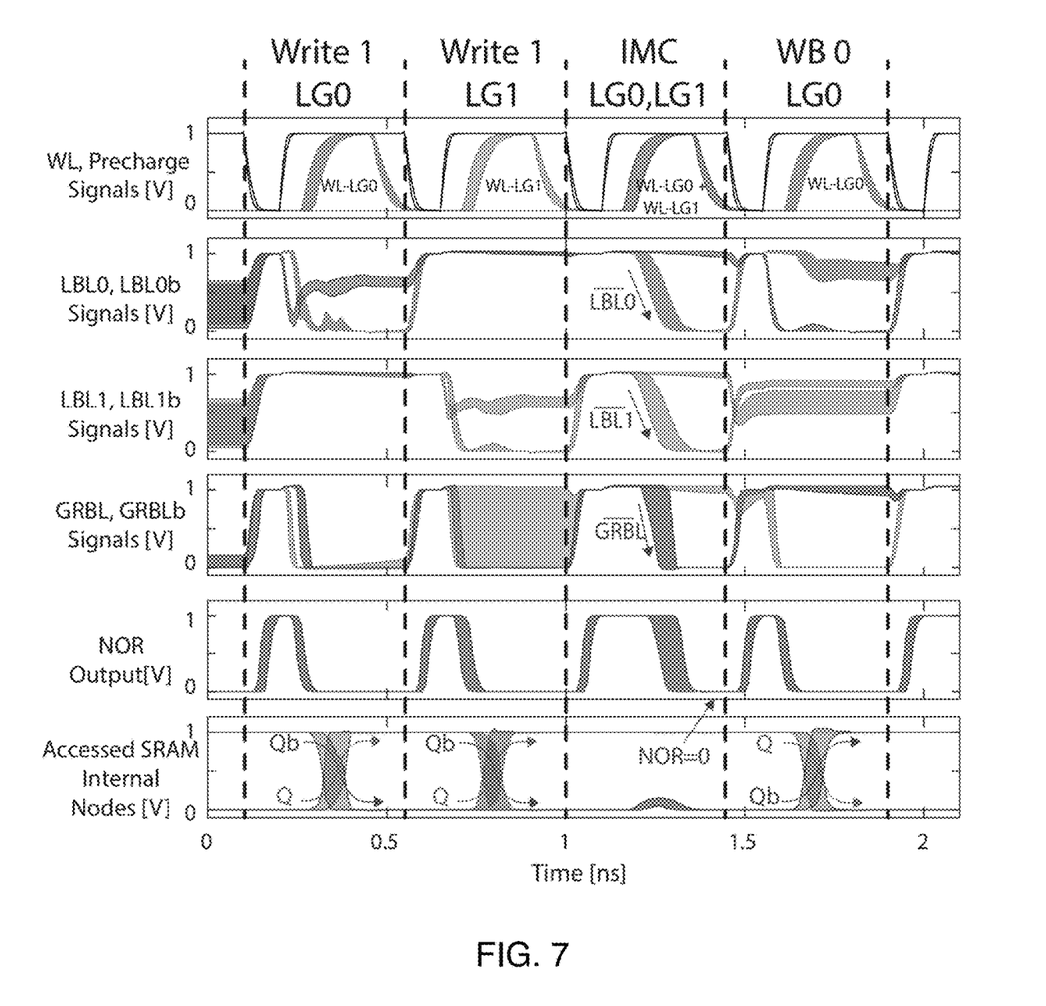
FIG. 7 shows results of timing signals of a transient signal simulation of a 256×64 memory array with two local groups (LG) with presented standard write, standard read, in-memory computing (IMC) operations and write back of in memory computed results, where envelopes of the variability simulations are shown in the right side of FIG. 7 for LG0 and on the left side of FIG. 7 for LG1.

FIG. 7 is a representation of a chronogram of successive operations performed in the worst-case/slowest BL of the memory array (i.e. the farthest bitcell from the WL driver). The two bitcells considered are the first bitcells of the top LGs (furthest from the LGRP and BL logic). In this chronogram, write operations are performed sequentially to initialize the two bitcells to "1", a NOR IMC operation is performed, and the result is written back to the first bitcell (switching its state). During the NOR operation, both $\overline{LBL0}$ and $\overline{LBL1}$ are discharging, in turn discharging the $\overline{GBL}$ which triggers the NOR output. At the end of the cycle, the NOR data is ready to be latched before the next operation cycle.

Figure 8:
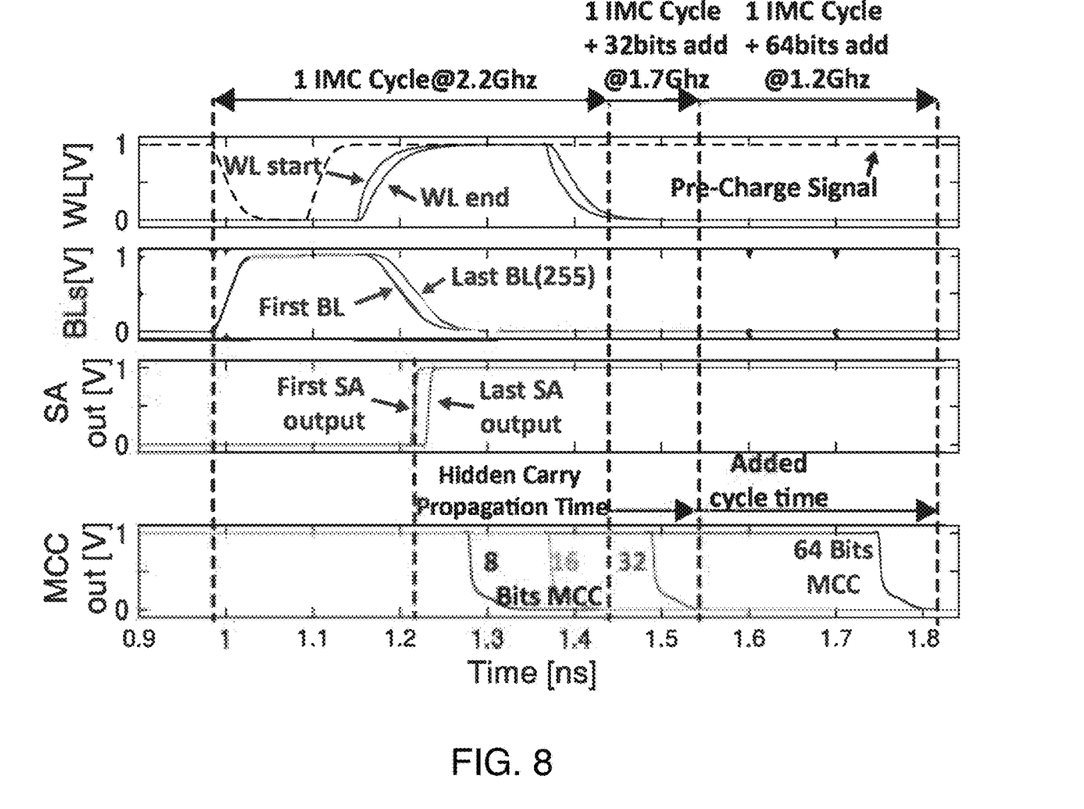
FIG. 8 shows exemplary propagation timing signals through the memory array for the first and the last of a 256 BL memory array. Added timing required to perform 32- and 64-bit additions is highlighted.

FIG. 8 shows a representation of the operation of the proposed MCC adder tied to the memory BL logic output signals with variability simulations (the MCC output shown is the slowest carry ripple among 10,000 Monte-Carlo runs). Carry ripple propagation begins simultaneously with the first BL operational block; however, carry propagation progresses slower than the rate at which data becomes ready from the memory array (simulation shows an average of 20 ps propagation time between the 1st and 256th BL). In addition, the WL discharge time is from 60 ps to 90 ps for the considered sizing (as proposed in [3], the WL in metal 1 is doubled with metal 3, in order to optimize the charging and discharging time). Taking into consideration mandatory design margins, it has been demonstrated that a 16 bit addition (100 ps to 150 ps with variability and post layout parasitics) can be performed during the IMC operation without any decrease in memory frequency within the synthesis limits of the target nano-scale technology node. This trade-off is further detailed below.

Figure 11:
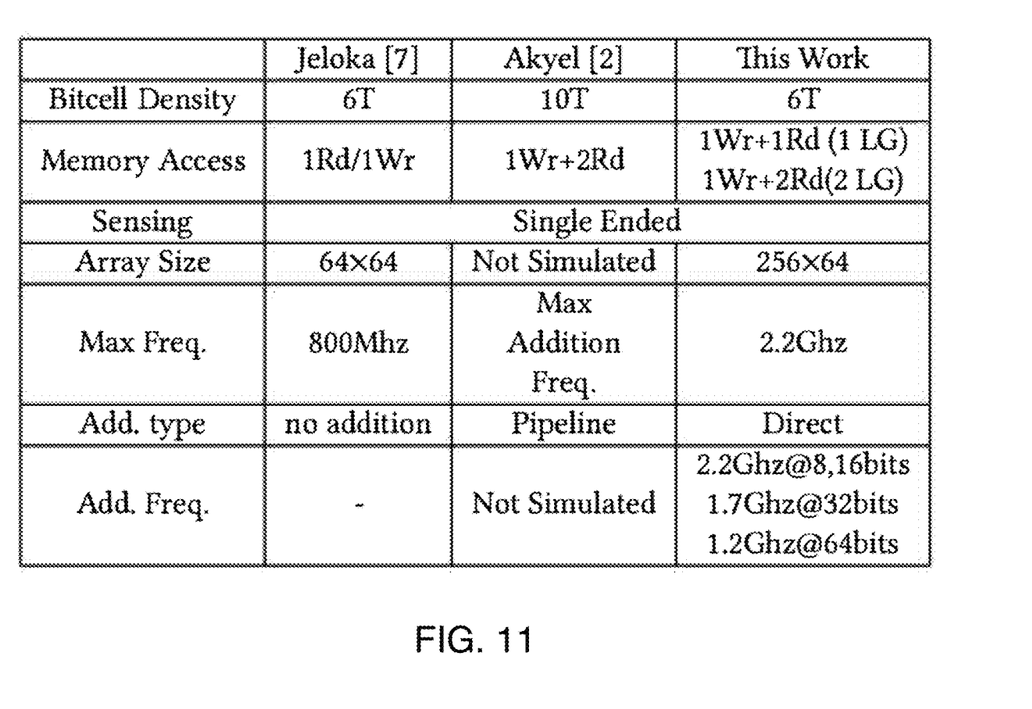
FIG. 11 shows a table that provides a summary of the proposed memory architecture with exemplary and non-limiting values and parameters compared to other types of in-SRAM IMC memories.

With respect to the performance results, the herein proposed memory architecture is benchmarked on three axes: (i) Area, (ii) Speed and (iii) Energy per operation. The Table of FIG. 11 presents different values and parameters of other IMC circuit architectures compared to the proposed memory architecture, with the exemplary 6T bitcell density.

Figure 9:
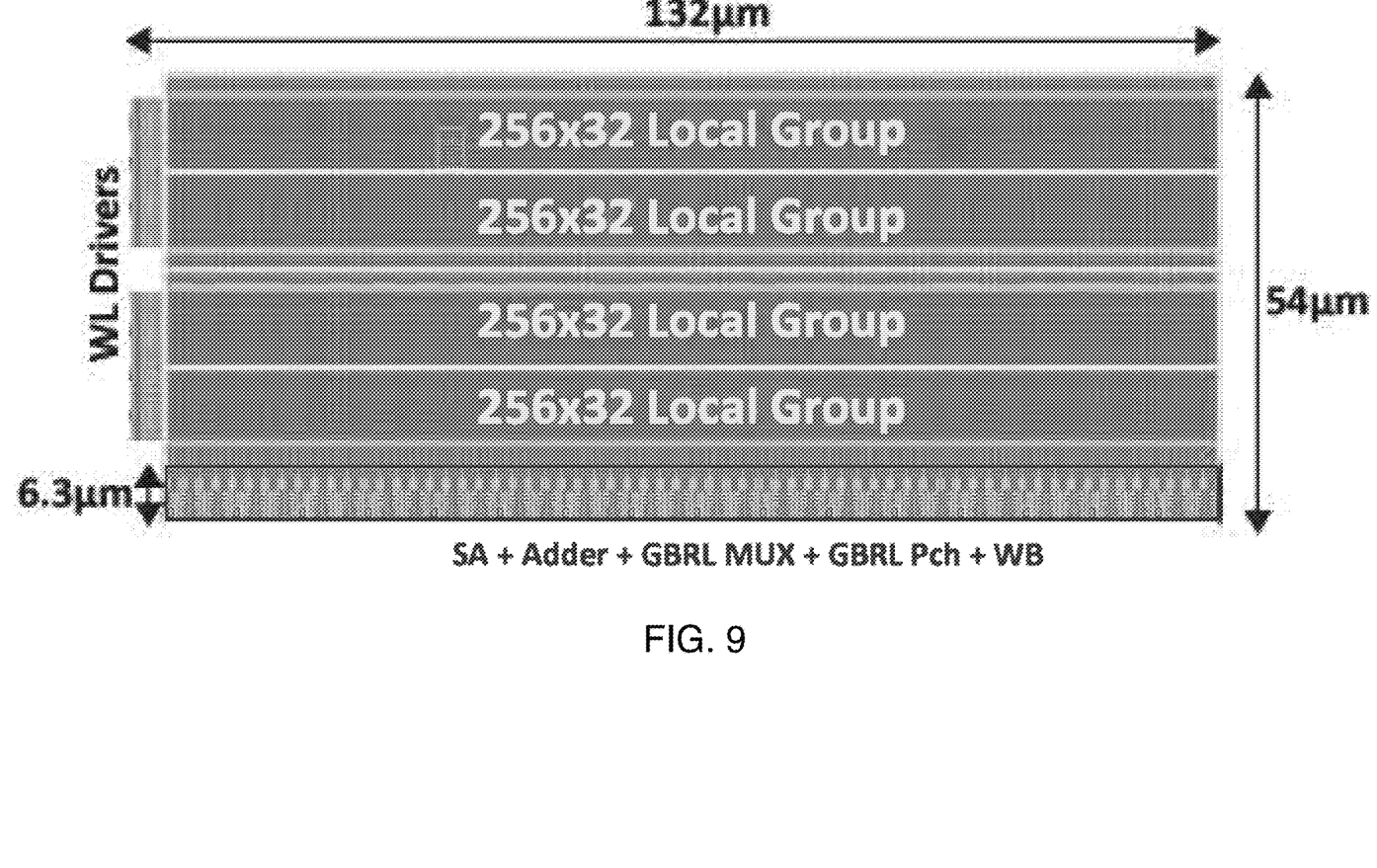
FIG. 9 shows the exemplary layout of a 256 BL×128 WL memory array using the proposed in-memory computing (IMC) architecture, enabling a 59.7% area efficiency with this architecture.

With respect to area estimation, FIG. 9 shows the layout view of a 256BL×128WL array spread over 4 LGs of 32WLs. Each LG is 11.7 µm×128.5 µm with its WL drivers. When considered alone, the a 32WL LG results in 71% area efficiency while 16, 64 and 128 WL LGs feature 55.6%, 83.4% and 91% area efficiencies respectively, to which must be added WL drivers and BL logic (the WL decoder is not considered as it will be shared with the neighbour array). While a larger LG enables better area efficiency, the LG size is limited by a decreasing read margin. Therefore, a co-optimization between circuit and application design is necessary to find optimal LG size. Overall, the 256BL by 128WL (32WL per LG) array shown in FIG. 9 provides a 59.7% area efficiency, of which the BL logic accounts for only 4%, while the simulated 256BL by 64WL (32WL per LG) array provides a 53.5% area efficiency.

With respect to the periphery pitch under the array, on the bottom of the memory, memory I/O (comprised of SA, BL logic, and WrA) is 6.3 µm tall, spread across 16 SRAM pitch (i.e. 8 µm as shown FIG. 5). While laying out the BL logic, we identified that a mux-4 ratio between the periphery and the array is the most efficient approach regarding the adder as it provides enough space (2 µm) to optimize its layout.

Figure 10:
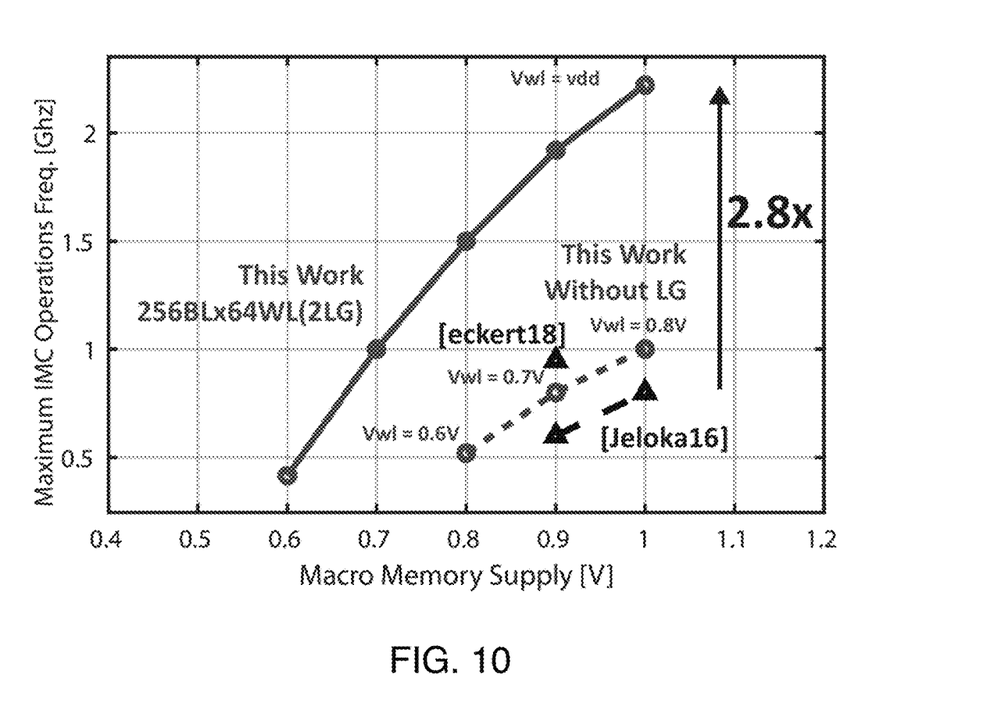
FIG. 10 shows a graph that represents a maximum frequency of bitwise operations versus memory macro supply voltage.

With respect to the speed evaluation of memory circuit and the bitwise operations, FIG. 10 shows the maximum clock frequency of different proposed IMC architectures compared to this work at various supply voltages. The solid curve shows the maximum frequency achievable by this work's architecture performing bitwise IMC operations while accessing simultaneously two LGs. On the other hand, the triangle markers refer to literature solutions not using LGs. Overall, LG-enabled IMC operation provides a 2.8× improvement versus standard architectures, while also enabling operation at 416 MHz and 0.6V, where standard architectures no longer function. As a reference, the memory architecture was simulated without using LGs (dotted curve), obtaining similar performance to previously published IMC solutions (1 Ghz at 1V with a WL voltage reduced to 0.8V). Higher performances can be achieved; for example, while keeping the same sizing for the peripheral driver circuits, we show that shorter WLs enable faster operations (2.5 Ghz at 1V for 64 BLs, not shown in FIG. 10).

Figure 12:
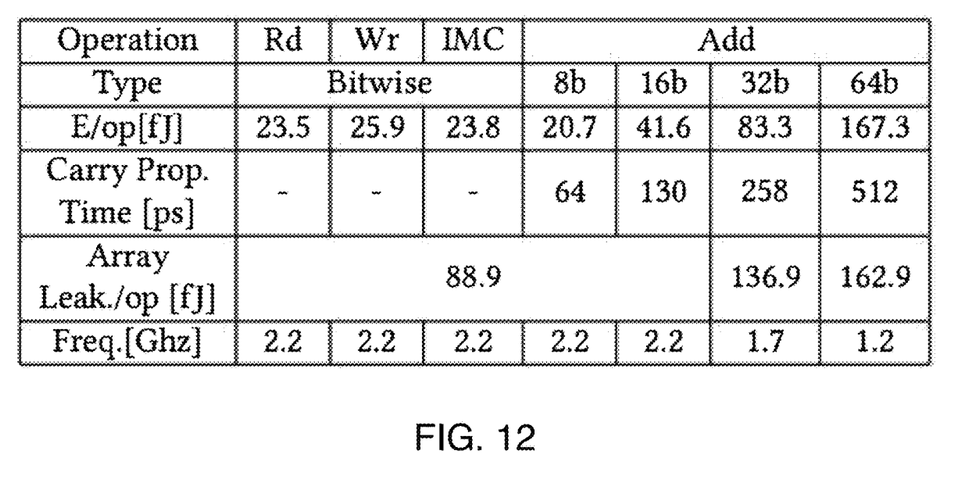
FIG. 12 shows a table that provides for Worst Case Energy and Frequency Values of IMC Operations in a 256×64 array.

With respect to the speed evaluation of memory circuit and the additions, FIG. 12 that depicts a table shows values of the worst-case ripple carry time and maximum computational frequency of the 4-bit buffered MCC adder with consideration for CMOS variability and layout effects. While 8/16-bit addition can be completed during the read pulse, 32/64-bit addition require reduced operating frequencies: 1.7 Ghz (1.2 Ghz for 64 bits). It can be noted here that considering smaller memories while keeping the same driver sizing (i.e., shorter discharge) would reduce the profitability of the proposed addition scheme as the ripple time does not scale with the WL charging-discharging time.

With respect to the energy assessment of the proposed memory design, the energy figures for each of the operations performed in the simulated 256BL by 64WL (32 WL per LG) memory are extracted and displayed in the table shown in FIG. 12. In these simulations the leakage of the entire memory array is included as the addition frequency is reduced with increasing bit depth. Bitwise IMC operations are performed at 2.2 Ghz while addition frequency is adapted depending on its depth. The adder energy scales almost linearly with its depth (leakage contribution from decreased frequency is <5% when moving from 2.2 to 1.2 Ghz), enabling a wide range of addition configurations (e.g.

8 parallel 8-bit additions or 1 single 64-bit addition) without impacting the memory power budget.

Figure 13:
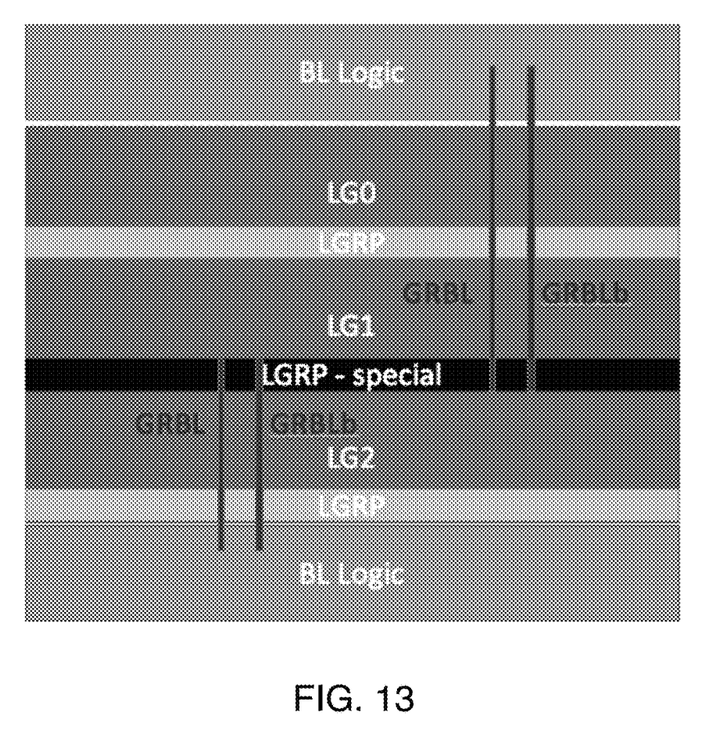
FIG. 13 shows a schematic representation of a memory array that has two different memory subarrays with two different access paths via a first and second global bitline pair GBL, and a first and a second bitline logic, respectively.

FIG. 13 shows another aspect of the present invention, where two different memory arrays, one memory array exemplarily with two local groups LG0 and LG1, and one memory array exemplarily with one local group LG2, and two different pairs of global read or write bitlines GBL for each memory array are presented. Moreover, one exemplary LGP is accessible by both pairs of global read or write bitlines GRBL or GWRL. As shown in FIG. 4, parallel to the arrangement of the GRBL, there are also global write bitlines GWRL, and in this configuration, the GRBL and the GWRL do not have to have the same length, and one could be connected to more local groups than the other. For example, it is possible that there are two (2) bitline logic, but there is only one GWRL connected to all the local groups LG0, LG1. In addition, each one of the pairs of GRBL are operatively connected to a bitline BL logic. This allows to provide for a memory architecture with different types of memory technologies, and allows to add further readout and write parallelism. The shared LGP is connected to the two sets of GRBL and have slightly more complex BL, with one single local precharge circuit (no change), two local Read Port (LRP), each connected to a different set of GRBL/GRBLb, and two write ports connected to the two BL operational blocks, if it is assumed that both the BL logic can write it. On the other hand, this can be done only if one of these BL operational blocks have access to this block.

As discussed above, according to at least some of the aspects of the present invention, a random-access memory and control method is provided that is fast (up to 2.2 Ghz), 6T SRAM-based, is very reliable by having no read disturb issues, and permits operation with wide voltage range (from 0.6 to 1 V) with an IMC architecture using local bitlines. Beyond standard read and write, with some aspects of the present invention, it is possible to perform copy, addition and shift operations at the array level. With addition being the slowest operation, according to another aspect of the present invention, a modified carry chain adder is proposed, providing a 2× carry propagation improvement. The proposed random-access memory and control method has been validated using an exemplary non-limiting design, with 28 nm bulk high performances technology process design kit (PDK) with CMOS variability and post-layout simulations. High density SRAM bitcells (0.127 μm) enable area efficiency of 59.7% for a 256×128 array, on par with current industrial standards. The functionality has been validated through electrical simulations accounting for variability and layout parasitic effects.

Moreover, the herein proposed random access memory and control method provides for a dense, reliable, and fast SRAM array that performs IMC operations at 2.3× to 2.8× the frequency of current state-of-the-art solutions. Also, according to yet some other aspects, the random-access memory and control method also enables fast in-memory addition: 2.2 Ghz for 8-16 bits, down to 1.2 Ghz for 64 bits. To accomplish this, a fast carry adder is provided that can be located underneath the memory array which outperforms a standard carry ripple adder by 60% to 70% depending on its depth.

In sum, the advantages over the state-of-the-art provide the following advantages. First, an innovative in-SRAM IMC architecture is provided that enables in-memory bitwise, addition, shift and copy operations. The architecture has been implemented exemplarily in a 28 nm bulk high-performance CMOS technology PDK and the method and operation has been demonstrated through CMOS variability and layout aware simulations. Second, the SRAM uses local read bitlines to (i) avoid data corruption issues during in-SRAM processing operations and (ii) enable high frequency operations (2.2 Ghz at 1V). Third, a method is proposed that allows to mask the carry propagation delay of in-memory addition and implement a fast carry adder to improve its performance, with a 60%-70% improvement, and fourth, the design space of the proposed SRAM/IMC memory architecture is optimized and improved to provide energy, area and speed values for various configurations.

In sum, as discussed above, a novel IMC-based memory architecture is proposed that relies on local bitline based IMC to perform a wide range of operations, for example AND, NOR, XOR, shift, copy, add, eliminating the problems of the state of the art and the lack of circuit and architecture evaluations of such memories. The proposed memory architecture operates within a wide range of supply voltages (0.6-1 V) without any added reliability degradation compared to standard SRAM architectures. Additionally, a way to improve the performance of IMC addition by implementing an MCC enhanced fast adder within the memory BL logic has been shown. The added BL logic reduces area efficiency by 4%. Overall the proposed architecture achieves up to 2.2 Ghz bitwise IMC and 16 bit addition or 32 bit (resp. 64) addition at 1.7 Ghz (resp. 1.2 Ghz) at 1V. Moreover, the proposed architecture can perform reliable bitwise operations down to 0.6V at a frequency of 416 MHz.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it has the full scope defined by the language of the following claims.

REFERENCES

[1] S. Aga, S. Jeloka, et al. 2017. Compute Caches. IEEE International Symposium on High Performance Computer Architecture (HPCA) (2017).
[2] Kaya Can Akyel, Henri-Pierre Charles, et al. 2016. DRC2: Dynamically Reconfigurable Computing Circuit based on memory architecture. IEEE International Conference on Rebooting Computing (ICRC) (2016).
[3] J. Chang, Y. Chen, et al. 2017. A 7 nm 256 Mb SRAM in high-k metal-gate FinFET technology with write-assist circuitry for low-VMIN applications. IEEE International Solid-State Circuits Conference (ISSCC) (2017).
[4] M. Chang, C. Chen, et al. 2015. A 28 nm 256 kb 6 T-SRAM with 280 mV improvement in VM!Nusing a dual-split-control assist scheme. IEEE International Solid-State Circuits Conference (ISSCC) (2015).
[5] Qyan Deng, Lei Jiang, et al. 2018. DrAcc: A DRAM Based Accelerator for Accurate CNN Inference. IEEEI-ACMIEDAC Design Automation Conference (DAC) (2018).
[6] Charles Eckert, Xiaowei Wang, et al. 2018. Neural Cache: Bit-Serial In-Cache Acceleration of Deep Neural Networks. ACM/IEEE International Symposium on computer Architecture (!SCA) (2018).
[7] Supreet Jeloka, Naveen Bharathwaj Akesh, et al. 2016. A 28 nm Configurable Memory (TCAM/BCAM/SRAM) Using Push-Rule 6T Bit Cell Enabling Logic-in Memory. IEEE Journal of Solid-State Circuits (JSSC) (2016).

[8] Mingu Kang, Eric P Kim, et al. 2015. Energy-efficient and high throughput sparse distributed memory architecture. IEEE International Symposium on Circuits and Systems (ISCAS) (2015), 2505-2508.
[9] H. Pilo, C. A. Adams, et al. 2013. A 64 Mb SRAM in 22 nm SOI technology featuring fine-granularity power gating and low-energy power-supply-partition techniques for 37% leakage reduction. IEEE International Solid-State Circuits Conference (ISSCC) (2013).
[10] M. Schlag and P. Chan. 1990. Analysis and Design of CMOS Manchester Adders with Variable Carry-Skip. IEEE Transactions on Computers (TC) (1990).
[11] Vivek Seshadri, Donghyuk Lee, et al. 2017. Ambit: In-memory Accelerator for Bulk Bitwise Operations Using Commodity DRAM Technology. IEEE/A CM International Symposium on Microarchitecture (MICRO) (2017).
[12] Mahmut E. Sinangil, Hugh Mair, et al. 2011. A 28 nm high-density 6T SRAM with optimized peripheral-assist circuits for operation down to 0.6V. IEEE International Solid-State Circuits Conference (ISSCC) (2011).
[13] Arun Subramaniyan, Jingcheng Wang, et al. 2017. Cache Automaton. IEEE/ACM International Symposium on Microarchitecture (MICRO) (2017).
[14] Shang-Lin Wu, Kuang-Yu Li, et al. 2017. A 0.5-V 28-nm 256-kb Mini-Array Based 6T SRAM With Vtrip-Tracking Write-Assist. IEEE Transactions on Circuits and Systems I (TCASI) (2017).

The invention claimed is:
1. A random-access memory comprising:
a memory array having a plurality of local memory groups, each local memory group including,
a plurality of bitcells arranged in a bitcell column;
a pair of local bitlines operatively connected to the plurality of bitcells;
a pair of global read bitlines;
a local group read port operatively arranged between the pair of local bitlines and the pair of global read bitlines for selectively accessing one of the local bitlines depending on a state of a selected bitcell;
a local group precharge circuit in operative connection with the pair of local bitlines; and
an in-memory computing logic including,
a global read bitlines multiplexer operatively connected to the pairs of global read bitlines of the plurality of local memory groups;
a bitline operational block operatively connected to an output of the global read bitlines multiplexer; and
an operation multiplexer operatively connected to an output of the bitline operational block.
2. The random-access memory of claim 1, wherein the operation multiplexer includes a write back latch and a write back multiplexer.
3. The random-access memory of claim 1, further comprising:
a word line driver operatively connected to word lines of the memory array;
two word line decoders operatively connected to inputs of the word line driver to provide for decoded addresses; and
a word line fusion circuit operatively connected to the decoded addresses.
4. The random-access memory of claim 3, wherein the local group precharge circuit is configured to pre-charge the pair of local bitlines to VDD before activating a word line by the word line driver.

5. The random-access memory of claim 1, further comprising:
a pair of amplifiers operatively connected to the pair of global read bitlines, respectively, for outputting data of the corresponding bitcells.
6. The random-access memory of claim 5, further comprising:
an operational block for performing at least one of a logic, analog, and/or mathematical operation on signals of the outputs of the amplifiers.
7. The random-access memory of claim 6, wherein the operational block includes a fast carry adder based on a dynamic Manchester Carry Chain adder operatively connected to outputs of the amplifiers.
8. The random-access memory of claim 7, wherein the fast carry adder is precharged by the local group precharge circuit.
9. The random-access memory of claim 1, wherein the memory array includes a first memory subarray and a second memory subarray, and a second pair of global read bitlines for accessing the second memory subarray.
10. The random-access memory of claim 1, wherein the bitline operational block includes at least one of a logic circuit for performing a logic operation and a arithmetic operational circuit to perform an arithmetic operation.
11. A memory chip comprising:
a static random-access memory array having a plurality of local memory groups, each local memory group including,
a bitcell column including a plurality of bitcells;
a pair of local bitlines operatively connected to the plurality of bitcells;
a pair of global read bitlines;
a local group read port operatively arranged between the pair of local bitlines and the pair of global read bitlines for selectively accessing one of the local bitlines depending on a state of a selected bitcell;
a local group precharge circuit in operative connection with the pair of local bitlines; and
an in-memory computing logic including,
a global read bitlines multiplexer operatively connected to the pairs of global read bitlines of the plurality of local memory groups;
a bitline operational block operatively connected to an output of the global read bitlines multiplexer; and
an operation multiplexer operatively connected to an output of the bitline operational block.
12. The memory chip of claim 11, wherein
the operation multiplexer includes a write back latch and a write back multiplexer.
13. The memory chip of claim 11, further comprising:
a word line driver operatively connected to word lines of the memory array;
two-word line decoders operatively connected to inputs of the word line driver to provide for decoded addresses; and
a word line fusion circuit operatively connected to the decoded addresses.
14. The memory chip of claim 13, wherein the local group precharge circuit is configured to pre-charge the pair of local bitlines to VDD before activating a word line by the word line driver.
15. The memory chip of claim 11, further comprising:
a pair of amplifiers operatively connected to the pair of global read bitlines, respectively, for outputting data of the corresponding bitcells.

16. The memory chip of claim 15, further comprising:
an operational block for performing at least one of a logic, analog, and/or mathematical operation on signals of the outputs of the amplifiers.

17. The memory chip of claim 16, wherein the operational block includes a fast carry adder based on a dynamic Manchester Carry Chain adder operatively connected to outputs of the amplifiers.

18. The memory chip of claim 17, wherein the fast carry adder is arranged in a buffered 4-bit configuration for sixteen (16) bitcell columns.

19. The memory chip of claim 17, wherein the fast carry adder is precharged by the local group precharge circuit.

20. The memory chip of claim 11, wherein the memory array includes a first memory subarray and a second memory subarray, and a second pair of global read bitlines for accessing the second memory subarray.

21. The memory chip of claim 11, wherein the bitline operational block includes at least one of a logic circuit for performing a logic operation and a arithmetic operational circuit to perform an arithmetic operation.

22. A random-access memory comprising:
a memory array having a plurality of local memory groups, each local memory group including,
a plurality of bitcells arranged in a bitcell column;
a pair of local bitlines operatively connected to the plurality of bitcells;
a pair of global read bitlines;
a local group read port operatively arranged between the pair of local bitlines and the pair of global read bitlines for selectively accessing one of the local bitlines depending on a state of a selected bitcell;
a local group precharge circuit in operative connection with the pair of local bitlines;
a word line driver operatively connected to word lines of the memory array;
at least two word line decoders operatively connected to inputs of the word line driver to provide for at least two decoded addresses; and
a word line fusion circuit operatively connected to the decoded addresses.

23. A memory chip having the random-access memory of claim 22.

24. The random access memory of claim 22, wherein the word line fusion circuit is configured to translate the decoded addresses from the at least two word line decoders into a single address that combines the at least two decoded addresses, each one of the least two decoded addresses activating one of the word lines.

* * * * *